United States Patent [19]
Brunelle

[11] Patent Number: 5,998,751
[45] Date of Patent: Dec. 7, 1999

[54] SORTING SYSTEM FOR COMPUTER CHIPS

[75] Inventor: Steve Brunelle, Boise, Id.

[73] Assignee: Micron Electronics, Inc., Nampa, Id.

[21] Appl. No.: 09/027,440

[22] Filed: Feb. 20, 1998

[51] Int. Cl.[6] .............................. B07C 5/344; B07C 5/00; H01H 31/02
[52] U.S. Cl. ......................... 209/573; 209/571; 209/546; 209/933; 324/537
[58] Field of Search ..................... 209/571, 572, 209/573, 546, 549, 933; 324/537, 555, 556

[56] References Cited

U.S. PATENT DOCUMENTS

| | | | |
|---|---|---|---|
| 2,902,152 | 9/1959 | Wilkes | 209/549 |
| 3,716,786 | 2/1973 | Gearin . | |
| 3,980,553 | 9/1976 | Quinn . | |
| 4,168,004 | 9/1979 | Owen | 209/900 |
| 4,388,994 | 6/1983 | Suda et al. | 209/900 |
| 4,478,352 | 10/1984 | Amundson et al. | 209/573 |
| 4,588,092 | 5/1986 | Moechnig et al. . | |
| 4,694,964 | 9/1987 | Ueberreiter . | |
| 4,826,019 | 5/1989 | Kondo et al. . | |
| 4,836,916 | 6/1989 | Kondo et al. . | |
| 4,871,963 | 10/1989 | Cozzi . | |
| 5,465,850 | 11/1995 | Kase . | |
| 5,470,427 | 11/1995 | Mikel et al. | 209/900 |
| 5,538,141 | 7/1996 | Gross, Jr. et al. . | |
| 5,568,870 | 10/1996 | Utech . | |
| 5,584,395 | 12/1996 | Homma . | |
| 5,603,412 | 2/1997 | Gross, Jr. et al. . | |
| 5,794,789 | 8/1998 | Payson et al. | 209/549 |
| 5,895,443 | 4/1999 | Gross, Jr. et al. | 209/571 |

Primary Examiner—Donald P. Walsh
Assistant Examiner—Daniel Keith Schlak
Attorney, Agent, or Firm—Knobbe, Martens, Olson & Bear, LLP

[57] ABSTRACT

Disclosed is a sorting system configured to sort a plurality of components, such as computer chips. The handler comprises a component handler configured to sort a plurality of components into groups; a plurality of receptacles on the component handler, each of the receptacles adapted to receive one of the sorted groups of components; at least one indicator associated with at least one of the receptacles, the at least one indicator being activated when the associated receptacle is filled to a selected amount with components; a plurality of bins, each of the bins being associated with one of the receptacles on the component handler; and at least one indicator on at least one of the bins, wherein the at least one indicator on the bin is activated when the receptacle associated with that bin is filled to a selected amount.

31 Claims, 3 Drawing Sheets

SORTING SYSTEM FOR COMPUTER CHIPS

RELATED APPLICATIONS

The subject matter of U.S. patent application entitled "METHOD OF SORTING COMPUTER CHIPS," filed on Feb. 20, 1998, application Ser. No. 09/027131, and having attorney Docket No. MPATENT.139A is related to this application.

BACKGROUND OF THE INVENTION

1. Field of the Invention

The invention relates to computer chips. More particularly, the invention relates to a system for efficiently testing and sorting computer chips.

2. Description of the Related Art

During production of computer chips, including memory chips, processor chips and the like, manufacturers often perform a series of tests on the chips to determine the chip quality, such as, for example, the percentage of memory cells that are functioning properly within the chip. The chips are often tested and sorted using a chip handler or handling device, which is a well-known device that performs a series of tests on the chips and then sorts the chips into groups according to the chip quality that was determined during testing.

For example, the chip handler may test the chips and determine that a certain number of the chips have memory cells with no defects. The chip handler assembles these chips together in a common group corresponding to chips of the highest quality. Other chips may be tested and found to have some memory cells that are defective. These chips are assembled together in a separate group corresponding to chips that have a lower quality. This process is repeated until all of the chips are tested and sorted into any of a wide number of groups with the chips in each group having a common level of quality.

After the chip handler tests and sorts the chips, an operator removes the chips from the chip handler and places the chips into a bin cart which has a number of separated bin spaces for storing each of the groups of chips. The operator normally maintains the chips in the bin cart in the same groups that were assembled by the chip handler so that the chips of one group are not mixed with the chips of another group. The chips are then packaged and sent to customers. Typically, the chip manufacturer sells even the lower quality chips to the customers, at a different price than the higher quality chips. The price that the manufacturer charges for a particular group of chips is largely dependent upon the quality of the chip. Generally, the manufacturer sells the lower quality chips at a lower price than that which is charged for the higher quality chips. It is therefore extremely important that the chips are sorted properly so that the manufacturer charges the customer the correct price for each of the chips.

Unfortunately, the person operating the chip handling device is often working at a very fast pace for hours at a time. Although this work is extremely important, it can also be very tedious. As a result, the operator can lose concentration and incorrectly mix the various groups of chips when removing the groups of chips from the chip handler. This results in the chips being sorted improperly so that the higher quality chips are mixed together with the lower quality chips and vice-versa. Although the operator may discover his or her mistake during the sorting process, it takes a great deal of time for the chips to be resorted and repackaged after the mistake has been discovered.

Additionally, the operator often does not realize until too late that he or she improperly mixed the chips. The improperly grouped chips are then sent to the customers, thus, a customer may pay a low price for a good quality chip that was accidentally grouped with poorer quality chips. This results in a loss of revenue for the manufacturer. Even worse, another customer may receive poor quality chips that were improperly grouped with the higher quality chips due to errors during the sorting process. This may cause problems in operation of the system into which the chip is incorporated. This results in a loss of customer good will and damage the reputation of the manufacturer.

There is, therefore, a need for a chip sorting system that avoids the aforementioned problems. The system should assist an operator in transferring computer chips from a chip sorter into a bin cart and reduce the likelihood of the chips being accidentally inserted into the wrong bin spaces in the bin cart.

SUMMARY OF THE INVENTION

The aforementioned needs are satisfied by the present invention which relates to an apparatus and system for sorting chips. In one aspect of the invention, there is disclosed a sorting system, comprising a component handler configured to sort a plurality of components into groups; a plurality of receptacles on the component handler, each of the receptacles adapted to receive one of the sorted groups of components; at least one indicator associated with at least one of the receptacles, the at least one indicator being activated when the associated receptacle is filled to a selected amount with components; a plurality of bins, each of the bins being associated with one of the receptacles on the component handler; and at least one indicator on at least one of the bins, wherein the at least one indicator on the bin is activated when the receptacle associated with that bin is filled to a selected amount.

In another aspect of the invention, there is disclosed a system for sorting components, comprising a component handler having a plurality of receptacles, the component handler adapted to sort a plurality of components into separate groups and deposit each of the groups into a separate receptacle, such that each of the components within a single one of the groups has a common property; a bin cart including a plurality of bin spaces, each of the bin spaces associated with one of the receptacles of the component handler; a plurality of identifiers on the component handler, wherein each of the identifiers has an associated receptacle and wherein each of the identifiers on the component handler is configured to illuminate when the associated receptacle is filled to a selected amount with components; and a plurality of identifiers on the bin cart, wherein each of the identifiers on the bin cart has an associated bin space and an associated identifier on the component handler and wherein each of the identifiers on the bin cart is configured to illuminate when the associated identifier on the component handler is illuminated.

In yet another aspect of the invention, there is disclosed a system for sorting a plurality of computer chips, comprising a plurality of computer chips arranged into groups, wherein each of the computer chips within a common group has a common property; a first plurality of receptacles, each of the receptacles in the first plurality of receptacles sized to hold one of the groups of computer chips; a second plurality of receptacles, each of the receptacles in the second plurality of receptacles sized to hold one of the groups of computer chips, wherein each of the receptacles in the second plurality of receptacles has an associated receptacle in the first plurality of receptacles; a first plurality of indicator lights coupled to the first plurality of receptacles for notifying a user when one of the receptacles in the first plurality of receptacles is filled to capacity; a second plurality of indicator lights coupled to the second plurality of receptacles, the second plurality of indicator lights configured to illuminate, so as to assist a user in transferring the computer chips from the first plurality of receptacles to the second plurality of receptacles; and a communication path linking the first plurality of indicator lights to the second plurality of indicator lights.

BRIEF DESCRIPTION OF THE DRAWINGS

These and other features of the invention will now be described with reference to the drawings of one embodiment, which are intended to illustrate and not to limit the invention, and in which.

DETAILED DESCRIPTION OF THE INVENTION

Figure 1:
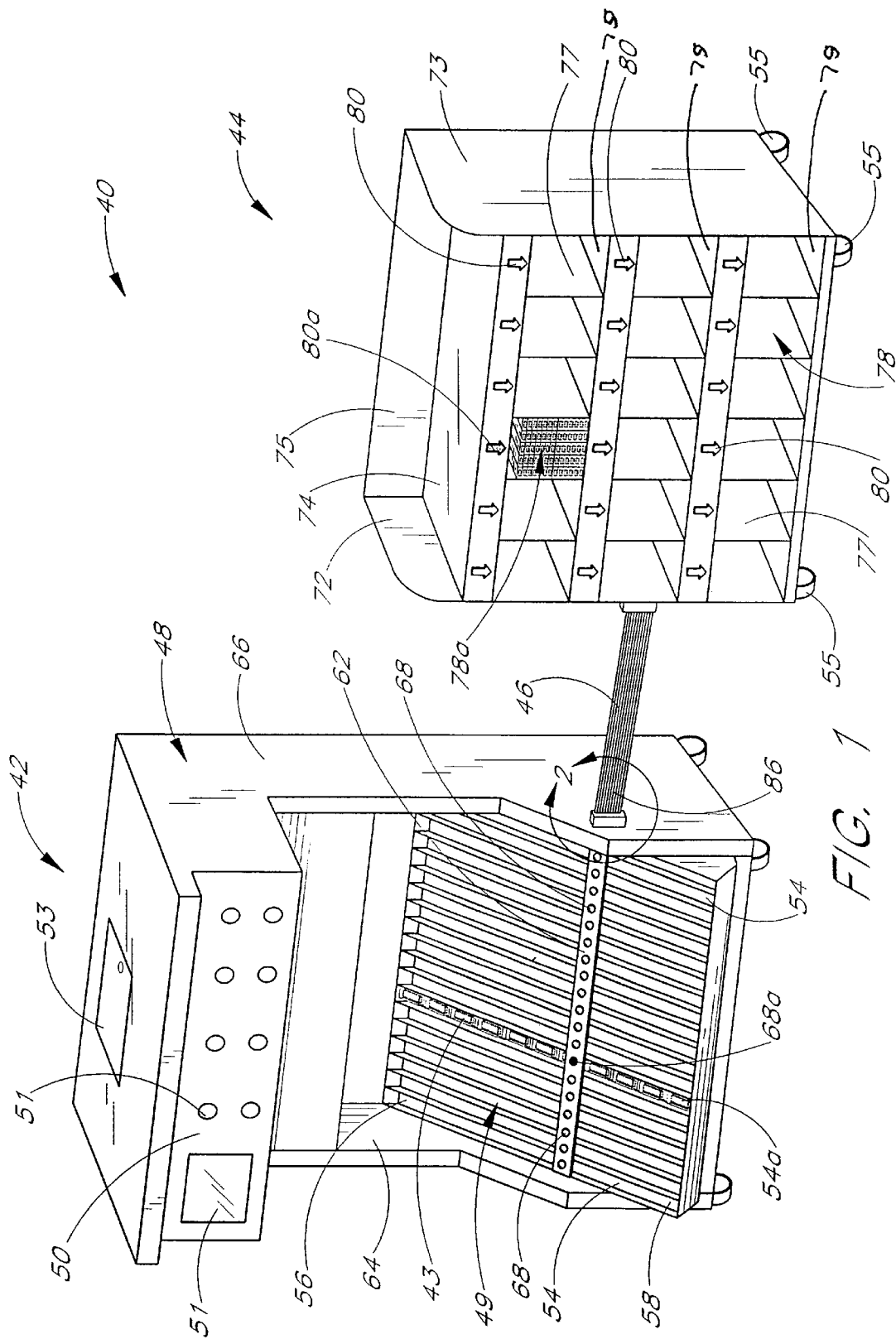
FIG. 1 is a perspective view of the chip sorting system of the invention, including a chip handler and a bin cart coupled thereto.

FIG. 1 is a perspective view of a component or chip sorting system 40 of the invention. The chip sorting system 40 includes a component or chip handler 42, which is a device that tests the quality of computer chips and then sorts the chips into groups according to their quality, as described more fully below. The chip sorting system 40 further includes a bin cart 44 in which an operator places the groups of chips after they are sorted by the chip handler 42. In accordance with one aspect of the invention, the chip handler 42 communicates with the bin cart 44 via a communication line or cable 46 to thereby assist the operator in correctly moving the groups of chips from the chip handler 42 to the bin cart 44, as described more fully below. Although described herein with respect to computer memory chips, it will be appreciated that any type of computer chips could be used. Additionally, the system described herein could also be readily applicable to the sorting of any of a wide variety of components or devices.

With reference to FIG. 1, the chip handler 42 comprises a main housing 48 having a front panel 50 positioned between a pair of side walls 64 and 66. The front panel 50 includes any of a wide variety of control devices 51 for controlling and monitoring the operation of the chip handler 42. The control devices 51 may comprise displays, keyboards, index switches, or any other of a wide variety of well-known control devices commonly used with chip handlers. A removable access panel 53 is located on the top of the main housing 48 to provide access to an internal chamber (not shown) in which chips are inserted by a user and then processed by the chip handler 42. It will be appreciated that the chip handler 42 may take on any of a wide variety of shapes and sizes.

The chip handler 42 may comprise any of a wide variety of well known computer chip handling devices that sort and group computer chips according to the quality of the chip. In one embodiment, the chip handler comprises an MP3050 series BY8/16 Environmental Handler, manufactured by Symtek. It will be appreciated that the process by which the chip handler 42 tests and sorts chips 43 is well known to those skilled in the art.

The main housing 48 of the chip handler 42 surrounds a track area 49 located between the side walls 64 and 66 and below the front panel 50 of the chip handler 42. The track area 49 includes several vertically-inclined tracks 54 that are aligned in rows adjacent one another. Each of the tracks 54 has a top end 56 and a bottom end 58 and is sized to slidingly receive the computer chips 43. In the illustrated embodiment, the tracks 54 are sized to receive a series or column of chips 43. Each track 54 is sized to hold a predetermined number of computer chips 43. The chip handler 42 deposits the computer chips 60 onto the tracks 54 after the chip handler 42 tests the quality of the computer chips 60. Desirably, all of the chips 43 within a single track belong to a single group of chips 43, as described more fully below.

With reference to FIG. 1, a support bar 62 extends over and across the track area 49 of the chip handler 42 between the side walls 64 and 66. A number of indicator lights 68 are located on the support bar 62. In the illustrated embodiment, the number of indicator lights 68 is equal to the number of tracks 54 in the track area 49 so that each of the indicator lights 68 has an associated track 54. For example, a track 54a has an associated indicator light 68a located on the support bar 62 immediately above the track 54a. It will be appreciated that the indicator lights 68 may be located anywhere on the chip handler 42 as long as each track 54 has an associated indicator light 68.

As shown in FIG. 1, the bin cart 44 is located adjacent the chip handler 42. The bin cart 44 is substantially rectangular-shaped and includes a pair of opposed side walls 72 and 73. The bin cart 44 also includes an upper platform 74 and a rear wall 75 connected thereto. The platform 74 and rear wall 75 are also connected to the side walls 72 and 73, and are each oriented substantially normal to the side walls 72 and 73. Several additional platforms 79 are located in a horizontal, stacked configuration below the platform 74. A number of intermediate walls 77 are positioned between and parallel to the side walls 72 and 73, and are oriented vertically so as to extend between pairs of the horizontal platforms 74, 75 and parallel to the side walls 72 and 73, so that the intermediate walls 77 define a plurality of bin spaces 78 which are each sized to receive groups of computer chips 43, as described in more detail below. In one embodiment, the number of bin spaces 78 in the bin cart 44 is equal to the number of tracks 54 in the chip handler 42. Accordingly, each of the tracks 54 in the chip handler 42 has an associated bin space 78 in the bin cart 44.

In the illustrated embodiment, the bin cart 44 also includes a set of wheels 55 to facilitate movement of the bin cart 44. It will be appreciated that the bin cart 44 may take on any of a wide variety of shapes and sizes and that the bin cart 44 may contain any of a wide number of bin spaces 78, although in the embodiment described herein, the number of bin spaces 78 is equal to the number of tracks 54 in the chip handler 42. Additionally, the size and shape of the bin spaces 78 may also be varied. The bin cart 44 may also be fixedly mounted on the ground adjacent the chip handler 42.

As shown in FIG. 1, a plurality of indicator lights 80 are located on the bin cart 44 above the bin spaces 78. Desirably, the number of indicator lights 80 is at least equal to the number of bin spaces 78 in the bin cart 44. Thus, each bin space 78 has an associated indicator light 80 that is easily identifiable with its associated bin space 78. For example, a bin space 78a on the bin cart 44 has an associated indicator light 80a located immediately above the bin space 78a. In the illustrated embodiment, each of the indicator lights 80 of the bin cart 44 is arrow-shaped and points at its associated bin space 78. This assists a user in identifying which bin space 78 corresponds to which indicator light 80. It will be appreciated, however, that the indicator lights 80 may take on any of a wide variety of shapes and sizes.

As discussed above, the communication cable 46 extends between the chip handler 42 and the bin cart 44. The communication cable 46 is elongated and includes a first end 86 and a second end 88. In the illustrated embodiment, the first end 86 of the communication handle 46 is coupled to the side wall 66 of the chip handler 42 near the location where the support bar 62 contacts the side wall 66. The second end 88 of the communication cable 46 is coupled to the side wall 72 of the bin cart 44. The communication cable 46 may have any of a wide variety of lengths. However, the communication cable 46 is desirably long enough to allow the chip handler 42 to be attached to the bin cart 44 via the communication cable 46 and yet still allow the bin cart 44 to be easily maneuvered on the wheels 55. In the embodiment shown in FIG. 1, the communication cable 46 is fixedly attached to the chip handler 42 and the bin cart 44. Alternatively, the communication cable 46 may be removably attached to the chip handler 42 and the bin cart 44, as described below with respect to FIG. 2.

Figure 2:
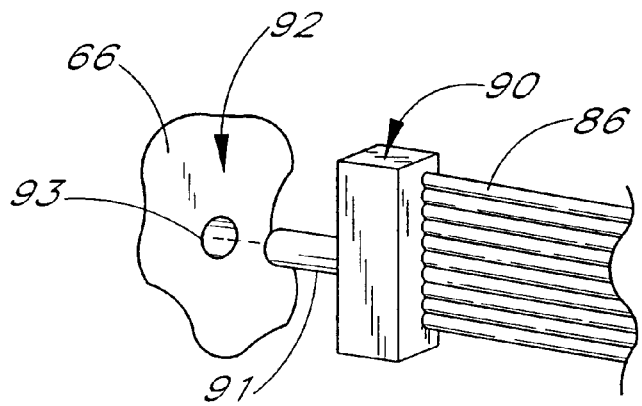
FIG. 2 is an enlarged perspective view of the portion of the side wall of the chip handler located within line 2 of FIG. 1.

FIG. 2 is an enlarged perspective view of the portion of the chip handler 42 within line 2 of FIG. 1. The first end 86 of the communication cable 46 includes a coupling member 90 that is configured to mate with a coupling member 92 on the side wall 64 of the bin cart 44. In the illustrated embodiment, the coupling member 90 comprises at least one male prong 91. The coupling device 92 on the chip handler 42 comprises a corresponding female receiving hole 93. The prong 91 is sized and shaped to fit within the corresponding female receiving hole 93. The second end 88 (FIG. 1) of the communication cable 46 and the side wall 72 of the bin cart 44 may also be equipped with a similar type of coupling configuration. It will be appreciated that the coupling members 90 and 92 could comprise any of a wide variety of well known electrical coupling devices, such as, for example, a forty pin IDE connector, a two-prong electrical connection, a three-prong connection, etc. Alternatively, the communication cable 46 could be fixedly mounted to the chip handler 42 and the bin cart 44.

The communication cable 46 provides a communication path between the chip handler 42 and the bin cart 44. That is, the communication cable 46 couples or links the indicator lights of 68 of the chip handler 42 to the indicator lights 80 of the bin cart 44. Desirably, when one of the indicator light 80 on the bin cart 44 is activated or illuminated, a corresponding indicator light 68 on the chip handler 42 is also illuminated, as described more fully below. In one embodiment, each of the indicator lights 68 of the chip handler 42 is hard-wired to a corresponding indicator light 80 on the bin cart 44 via the communication cable 46, as described more fully below. For example, the indicator light 68a on the chip handler 42 may be hard-wired to the indicator light 80a on the bin cart 44 so that the indicator light 80a automatically illuminates when the indicator light 68a illuminates. It is also contemplated that rather than direct wiring, a software program could be used to determined which of the indicator lights 68 on the chip handler 42 is illuminated. The software would then illuminate a corresponding indicator light 80 on the bin cart 44. The communication cable 46 could also be replaced with a remote interface, such as an infrared signal device for communicating between the chip handler 42 and the bin cart 44.

In operation, the chip sorting system 30 may be used to test and sort computer chips according to certain criteria relating to the quality of the chip, such as, for example, the percentage of memory cells in the chip that are working correctly or the rated speed of a processor. An operator first inserts a group of chips into the chip handler 42 via the removable access panel 53. The chip handler 42 then tests the chips and determines a quality level of the chip. For example, certain chips may have 100% of their memory cells working properly and other chips may have 50% of their memory cells working properly or some processor may correctly operate at clock speeds higher than others. After determining the quality of the chips, the chip handler 42 sorts the chips into groups according to the quality of the chip. Desirably, the chip handler 42 sorts the chips into groups using the tracks 54 so that all of the chips within a single track 54 are chips of a common quality level. As mentioned, the process by which the chip handler 42 tests and sorts the chips is well known to those skilled in the art.

FIG. 1 illustrates the track 54a as filled to capacity with chips 43. For purposes of example, assume all of the chips 43 in the track 54a have 50 percent of their memory cells working correctly, as determined by the chip handler 42. Once the track 54a is filled to capacity with chips, the corresponding indicator light 68a is illuminated, such as through a switch that is closed when a predetermined number of chips enter the track 68a. In this manner, the indicator light 68a notifies the person operating the chip handler 42 that the track 54a is filled to capacity. In a similar manner, the other indicator lights on the chip handler 42 also illuminate when their corresponding tracks have been filled to capacity.

Figure 3:
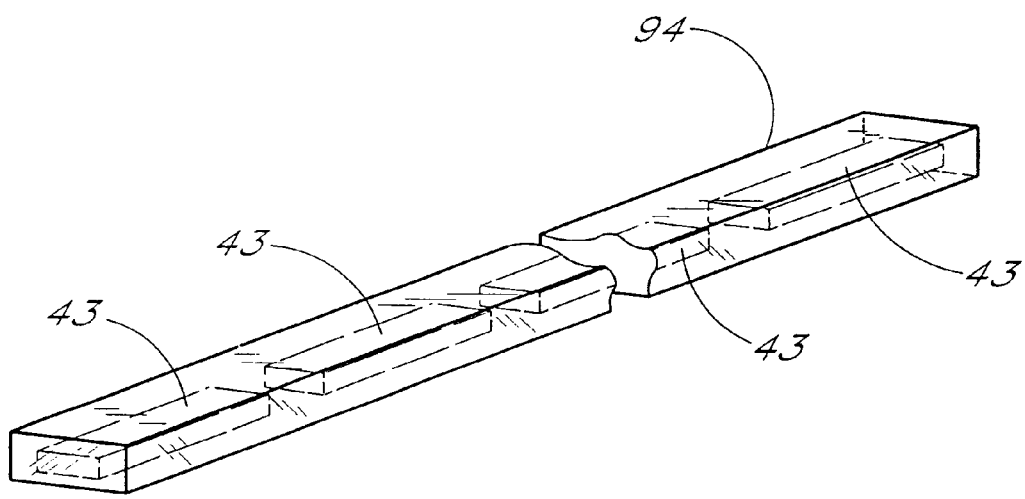
FIG. 3 is a perspective view of a plurality of chips housed within a chip packaging.

After a track 54 is filled to capacity, the operator then empties the chips 43 of the filled-to-capacity track 54 into a package 94, such as the type shown in FIG. 3. It will be appreciated that the package 94 may comprise any of a wide variety of packaging materials for computer chips and that the package 94 may be configured to hold any of a wide number of computer chips. In the illustrated embodiment, the package 94 comprises an elongated tube of material, such as plastic, that is sized to receive a number of chips. The bottom end 58 of each of the tracks 54 may be fitted with a release door that is opened to allow the chips to slide downward from the track 54 into the package 94. Alternatively, the operator may simply lift the chips individually from the track 54. After removing the group of chips 43 from the filled-to-capacity track, the operator then transfers the group of chips 43 to one of the bin spaces 78 on the bin cart 44.

When an indicator light 68 on the chip handler 42 is illuminated, a corresponding indicator light 80 on the bin space is also illuminated. As mentioned, the communication cable 46 provides a communication path between the indicator lights 68 on the chip handler 42 and the corresponding indicator lights 80 on the bin cart 44. The bin space 78 below the particular indicator light 80 that is illuminated is the bin space that is used to store the chips from the track 54 that was filled to capacity. Advantageously, the indicator light 80 continues to be lit after the operator removes the chips 43 from the chip handler 42, thereby notifying the operator as to which of the bin spaces 78 the chips are to be transferred into.

More particularly, in the illustrated embodiment, the indicator light 68a on the chip handler 42 is illuminated, indicating that the track 54a is filled to capacity. The corresponding indicator light 80a on the bin cart is also illuminated to notify the operator that the chips from the track 54a should be inserted into the associated bin space 78a. This greatly reduces the likelihood of the operator placing the chips into the wrong bin space 78 and mixing up the chips after they have been sorted by the chip handler 42. It is contemplated that the indicator lights 80 on the bin cart 44 may be illuminated in response to the operator removing chips from the track 54 or opening the release device on the track 54. Advantageously, the indicator lights 80 on the bin cart 44 assist the user in properly removing the chips from the chip handler 42 and then inserting the chips into the proper bin space 78 in the bin cart 44. In one embodiment, the indicator lights 68 and 80 remain illuminated until the user depresses an acknowledgment switch that removes power to the illuminated lights 68 and 80.

Figure 4:
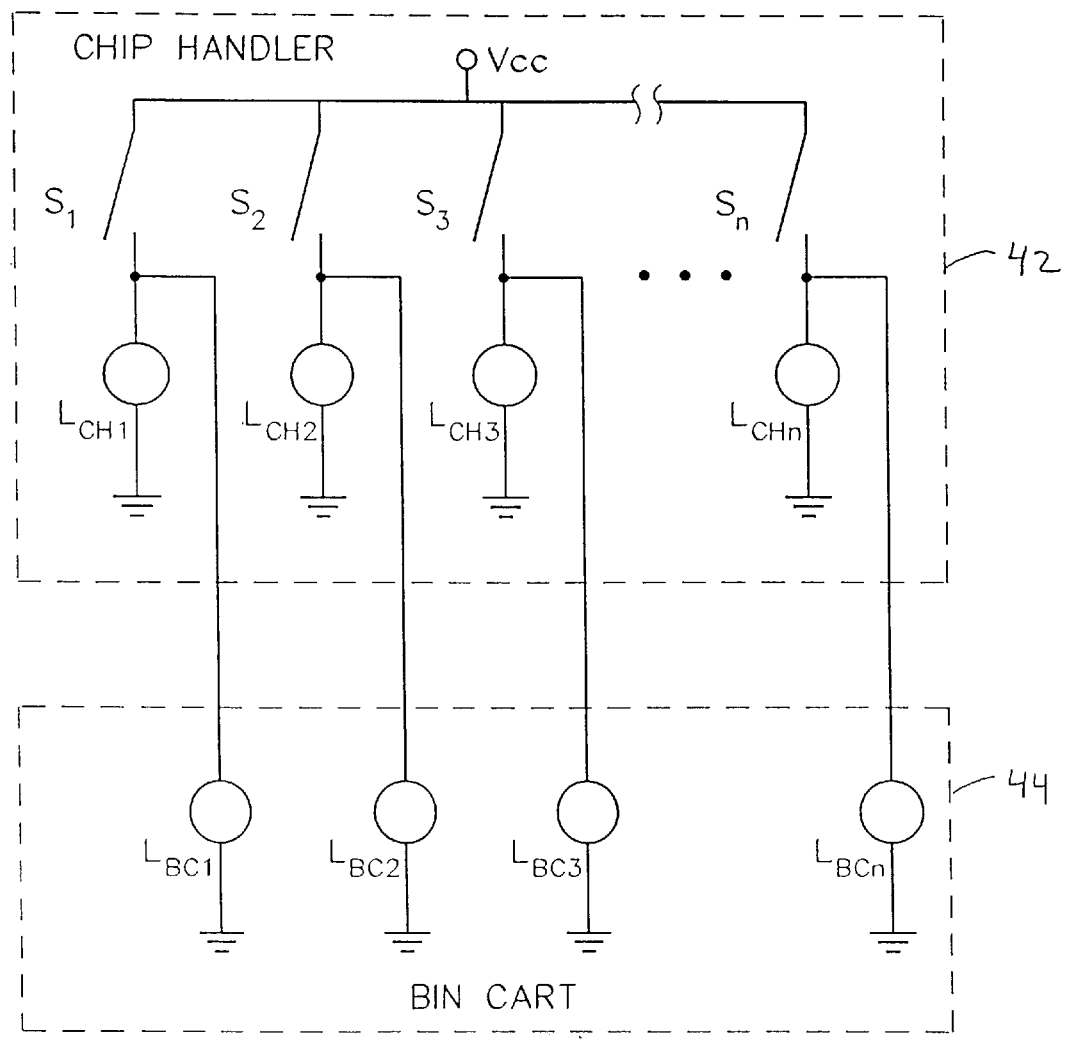
FIG. 4 is a circuit diagram illustrating one embodiment of an electrical interface used in the chip sorting system of FIG. 1.

With reference to FIG. 4, one embodiment of the electrical interface between the chip handler 42 and the bin cart 44 is schematically illustrated in a circuit diagram. A plurality of controlled switches $S_1$ through $S_n$ connect a voltage source 140 to each of the indicator lights $L_{CH1}$ through $L_{CHn}$ on the chip handler 42, where n is the number of indicator lights on the chip handler 42. The indicator lights $L_{CH1}$ through $L_{CHn}$ on the chip handler 42 are wired in parallel (via the communication cable 46) to corresponding indicator lights $L_{BC1}$ through $L_{BCn}$, respectively, on the bin cart 44. There is a common electrical ground between the chip handler 42 and the bin cart 44.

When one of the tracks 54 on the chip handler 42 is filled to capacity, the switch S on the corresponding track is closed. The corresponding indicator light $L_{CH}$ is then illuminated. The indicator light $L_{BC}$ on the bin cart 44 is also energized and illuminated when the switch S closes. In one embodiment, the user acknowledges transfer of the chips from the chip handler 42 to the bin cart 44 by manually opening the switch S, such as through a control button on the chip handler 42 or the bin cart 44. It will be appreciated that the illustrated circuit could also be varied or replaced with an encoder to signal between the chip handler 42 and the bin cart 44.

The chip sorting system 40 of the present invention thus advantageously assists an operator in properly packaging and arranging chips after they have been sorted by the chip handler 42. The coupling of the indicator lights 68 on the chip handler 42 to the indicator lights 80 on the bin cart 44 reduces the likelihood of the operator improperly mixing the groups of chips after the chips are sorted by the chip handler 42.

Hence, although the foregoing description of the invention has shown, described, and pointed out fundamental novel features of the invention, it will be understood that various omissions, substitutions, and changes in the form of the detail of the apparatus and method as illustrated as well as the uses thereof, may be made by those skilled in the art without departing from the spirit of the invention. Consequently, the scope of the invention should not be limited to the foregoing discussion, but is defined by the appended claims.

What is claimed is:

1. A sorting system, comprising:
   a component handler configured to sort a plurality of components into groups;
   a plurality of receptacles on the component handler, each of the receptacles adapted to receive one of the sorted groups of components;
   at least one indicator associated with at least one of the receptacles, said at least one indicator being activated when the associated receptacle is filled to a selected amount with components;
   a plurality of bins, each of the bins being associated with one of the receptacles on the component handler; and
   at least one indicator on at least one of the bins, wherein the at least one indicator on the bin is activated when the receptacle associated with that bin is filled to a selected amount.

2. The system of claim 1, wherein the number of receptacles is equal to the number of bins.

3. The system of claim 1, additionally comprising a communication path linking the component handler to the bins.

4. The system of claim 3, wherein the communication path comprises an electrical cable.

5. The system of claim 4, wherein the electrical cable is removably mounted between the bin cart and the component handler.

6. The system of claim 1, wherein the components comprise computer chips.

7. The system of claim 1, wherein the receptacle being filled to a selected amount comprises the receptacle being filled to capacity with components.

8. The system of claim 1, wherein the indicators on the component handler are lights.

9. The system of claim 1, wherein the indicators on the receptacles are lights.

10. The system of claim 9, wherein each of the indicator lights on the receptacles are configured to point to their associated bin.

11. The system of clam 1, wherein one of the indicator lights on the component handler illuminates when a component is removed from the receptacle associated with that indicator light.

12. The system of claim 1, wherein the receptacles are movable.

13. A system for sorting components, comprising:
   a component handler having a plurality of receptacles, the component handler adapted to sort a plurality of components into separate groups and deposit each of the groups into a separate receptacle, such that each of the components within a single one of the groups has a common property;
   a bin cart including a plurality of bin spaces, each of the bin spaces associated with one of the receptacles of the component handler;
   a plurality of identifiers on the component handler, wherein each of the identifiers has an associated receptacle and wherein each of the identifiers on the component handler is configured to illuminate when the associated receptacle is filled to a selected amount with components; and
   a plurality of identifiers on the bin cart, wherein each of the identifiers on the bin cart has an associated bin space and an associated identifier on the component handler and wherein each of the identifiers on the bin cart is configured to illuminate when the associated identifier on the component handler is illuminated.

14. The system of claim 13, wherein the components are computer chips.

15. The system of claim 13, wherein the number of receptacles in the component handler is equal to the number of identifiers in the bin cart.

16. The system of claim 15, wherein the identifiers in the component handler are lights.

17. The system of claim 13, wherein the identifiers in the bin cart are lights.

18. The system of claim 13, wherein the receptacles on the component handler comprise tracks sized to receive a column of components.

19. The system of claim 13, additionally comprising a communication path linking the component handler and the bin cart.

20. The system of claim 19, wherein the communication path is an electrical cable.

21. The system of claim 20, wherein the electrical cable is removably coupled to the bin cart and the component handler.

22. A system for sorting a plurality of computer chips, comprising:
- a plurality of computer chips arranged into groups, wherein each of the computer chips within a common group has a common property;
- a first plurality of receptacles, each of the receptacles in the first plurality of receptacles sized to hold one of the groups of computer chips;
- a second plurality of receptacles, each of the receptacles in the second plurality of receptacles sized to hold one of the groups of computer chips, wherein each of the receptacles in the second plurality of receptacles has an associated receptacle in the first plurality of receptacles;
- a first plurality of indicator lights coupled to the first plurality of receptacles for notifying a user when one of the receptacles in the first plurality of receptacles is filled to capacity;
- a second plurality of indicator lights coupled to the second plurality of receptacles, the second plurality of indicator lights configured to illuminate, so as to assist a user in transferring the computer chips from the first plurality of receptacles to the second plurality of receptacles; and
- a communication path linking the first plurality of indicator lights to the second plurality of indicator lights.

23. The system of claim 22, wherein the first plurality of receptacles is located on a chip handler configured to test the plurality of computer chips and sort the plurality of computer chips into the groups, the chip handler further configured to deposit each of the groups of computer chips into a separate receptacle from the first plurality of receptacles.

24. The system of claim 23, wherein the first plurality of receptacles comprise a plurality of tracks sized to receive a column of the computer chips.

25. The system of claim 22, wherein the number of receptacles in the first plurality of receptacles is equal to the number of receptacles in the second plurality of receptacles.

26. The system of claim 22, wherein the communication path is an electrical cable.

27. The system of claim 26, wherein the electrical cable is removably coupled to the first plurality of receptacles and the second plurality of receptacles.

28. The system of claim 22, wherein the communication path is fixedly mounted to the first plurality of receptacles and the second plurality of receptacles.

29. The system of claim 22, wherein the communication path includes a number of wires equal to the number of indicator lights in the first plurality of indicator lights.

30. The system of claim 22, wherein the second plurality of receptacles is located on a bin cart.

31. The system of claim 22, wherein the number of indicator lights in the first plurality of indicator lights is equal to the number of indicator lights in the second plurality of indicator lights.

* * * * *